(12) United States Patent
Doris et al.

(10) Patent No.: US 9,490,335 B1
(45) Date of Patent: Nov. 8, 2016

(54) EXTRA GATE DEVICE FOR NANOSHEET

(71) Applicant: INTERNATIONAL BUSINESS MACHINES CORPORATION, Armonk, NY (US)

(72) Inventors: Bruce B. Doris, Slingerlands, NY (US); Terence B. Hook, Jericho, VT (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/984,280

(22) Filed: Dec. 30, 2015

(51) Int. Cl.
| | |
|---|---|
| *H01L 21/70* | (2006.01) |
| *H01L 29/423* | (2006.01) |
| *H01L 27/092* | (2006.01) |
| *H01L 29/66* | (2006.01) |
| *H01L 21/8238* | (2006.01) |
| *H01L 29/161* | (2006.01) |
| *H01L 29/16* | (2006.01) |
| *H01L 29/06* | (2006.01) |
| *H01L 29/78* | (2006.01) |
| *H01L 29/775* | (2006.01) |

(52) U.S. Cl.
CPC . *H01L 29/42392* (2013.01); *H01L 21/823807* (2013.01); *H01L 21/823821* (2013.01); *H01L 21/823828* (2013.01); *H01L 21/823857* (2013.01); *H01L 27/0922* (2013.01); *H01L 27/0924* (2013.01); *H01L 27/0928* (2013.01); *H01L 29/0665* (2013.01); *H01L 29/0673* (2013.01); *H01L 29/16* (2013.01); *H01L 29/161* (2013.01); *H01L 29/66439* (2013.01); *H01L 29/66795* (2013.01); *H01L 29/775* (2013.01); *H01L 29/785* (2013.01)

(58) Field of Classification Search
CPC ............... H01L 29/78696; H01L 29/0673; H01L 29/42392; H01L 29/66439; H01L 29/0665
See application file for complete search history.

(56) References Cited

U.S. PATENT DOCUMENTS

| | | | |
|---|---|---|---|
| 7,462,538 B2 | 12/2008 | Li et al. | |
| 8,507,988 B2 | 8/2013 | Yao et al. | |
| 8,581,353 B2 | 11/2013 | Bai | |
| 8,633,094 B2 | 1/2014 | Ramdani et al. | |
| 8,722,472 B2 | 5/2014 | Chang et al. | |
| 2011/0031473 A1* | 2/2011 | Chang ................ | B82Y 10/00 257/24 |
| 2012/0175696 A1 | 7/2012 | Franzon et al. | |
| 2014/0197377 A1 | 7/2014 | Kim et al. | |
| 2015/0200308 A1 | 7/2015 | Karda et al. | |
| 2015/0295084 A1 | 10/2015 | Obradovic et al. | |

FOREIGN PATENT DOCUMENTS

| | | |
|---|---|---|
| CN | 101421850 A | 4/2009 |
| CN | 104282625 A | 1/2015 |

* cited by examiner

*Primary Examiner* — Jesse Y Miyoshi
(74) *Attorney, Agent, or Firm* — Tutunjian & Bitetto, P.C.; Vazken Alexanian

(57) ABSTRACT

A method for forming semiconductor devices includes forming a highly doped region. A stack of alternating layers is formed on the substrate. The stack is patterned to form nanosheet structures. A dummy gate structure is formed over and between the nanosheet structures. An interlevel dielectric layer is formed. The dummy gate structures are removed. SG regions are blocked, and top sheets are removed from the nanosheet structures along the dummy gate trench. A bottommost sheet is released and forms a channel for a field effect transistor device by etching away the highly doped region under the nanosheet structure and layers in contact with the bottommost sheet. A gate structure is formed in and over the dummy gate trench wherein the bottommost sheet forms a device channel for the EG device.

8 Claims, 17 Drawing Sheets

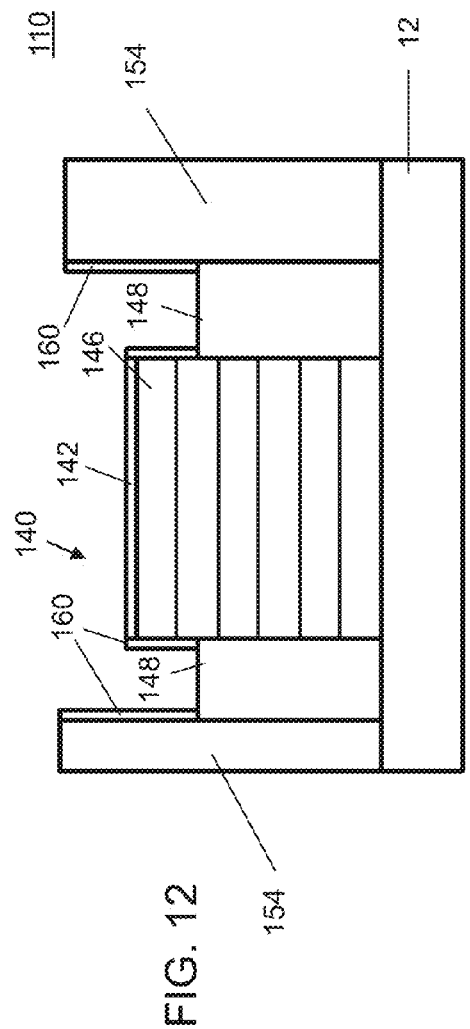
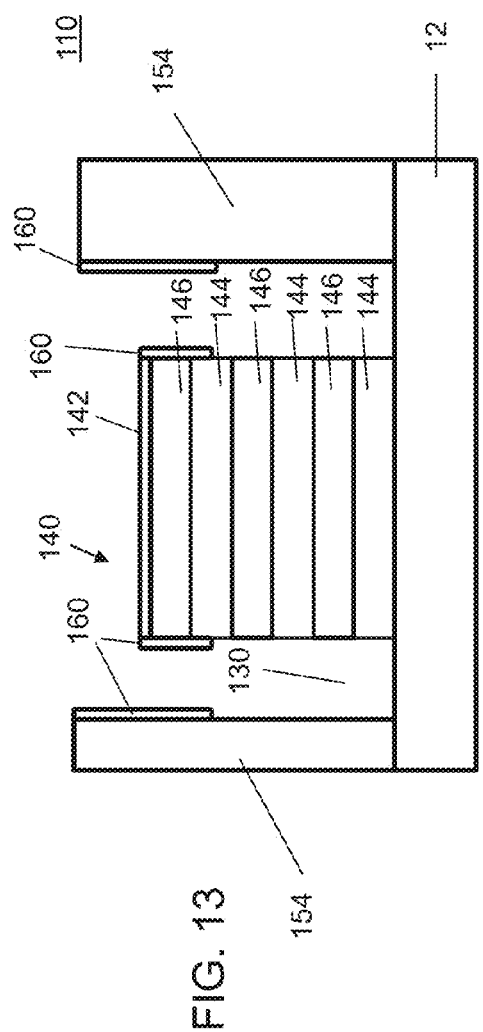

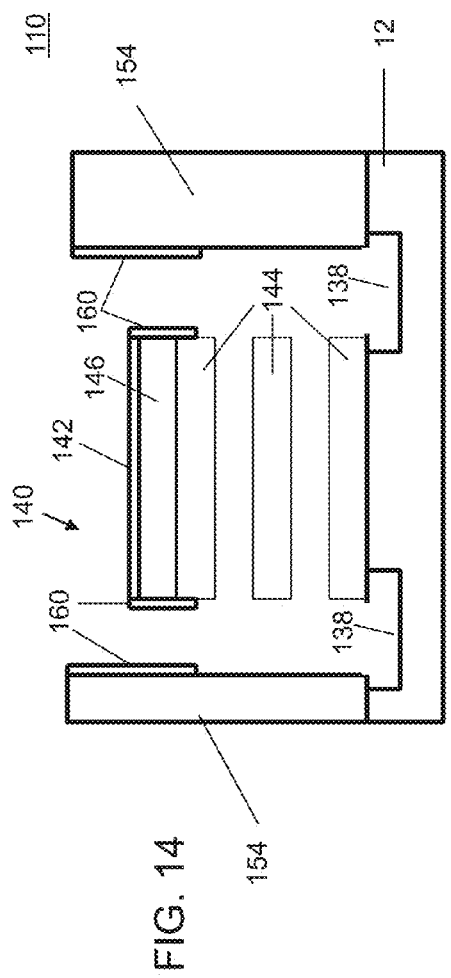
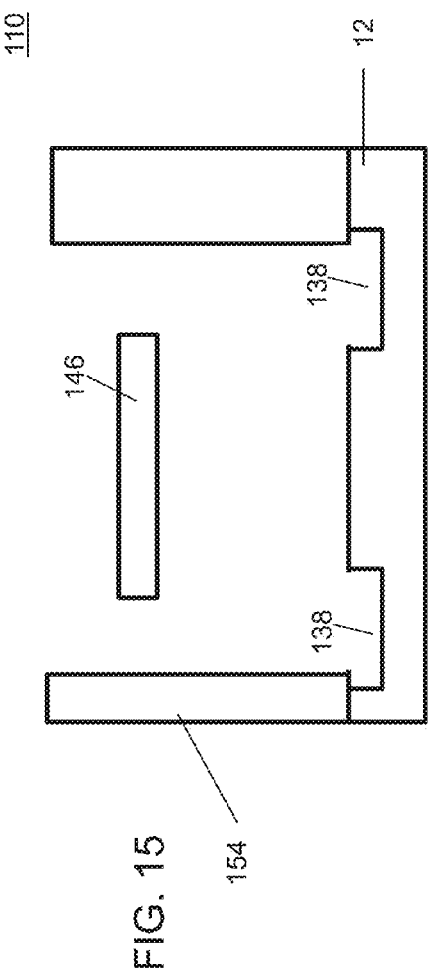

EXTRA GATE DEVICE FOR NANOSHEET

BACKGROUND

Technical Field

The present invention relates to extra gate (EG) device integration into nanosheet fin complementary metal oxide semiconductor (CMOS) devices, and more particularly to devices and methods for making the same.

Description of the Related Art

In nanometer scale devices, gate structures are often disposed between fin structures or other conducting structures, such as nanosheets. In many instances, the conducting or semiconducting structures are formed closer together due to scaling to smaller node technology sizes. This can be a limiting factor in the reduction of the device size scaling.

While finFETs and/or nanosheets can benefit from tight device-device spacing, these dimensions may limit scaling of these devices. Further, devices requiring thicker dielectric for higher voltage operation are even more severely limited in the allowable dimensions. Higher voltage devices for input/output circuits require thicker gate dielectrics as compared to standard gate devices, which have a lower voltage and may be employed, e.g., in logic devices. However, spacing between sheets needs to be small to realize capacitance benefits.

The increased gate dielectric thickness needed for high voltage devices is thicker than the optimal space between sheets. Thus, there is a need for a new device structure and method to build the structure to enable the integration of high voltage or extra gate devices with standard nanosheet devices.

SUMMARY

A method for forming semiconductor devices includes doping a surface of a substrate in exposed areas where extra gate (EG) devices are to be formed to form a highly doped region and forming a stack of alternating layers on the substrate over single gate (SG) regions and the EG regions. The stack is patterned to form nanosheet structures. A dummy gate structure is formed over and between the nanosheet structures. An interlevel dielectric layer is formed over the dummy gate structure and the nanosheet structures, and dummy gate structures are removed to form a dummy gate trench. The SG regions are blocked. Top sheets are removed from the nanosheet structures along the dummy gate trench. At least one bottommost sheet including a semiconductor layer is released to form a channel for a field effect transistor device by etching away the highly doped region under the nanosheet structure and layers in contact with the at least one bottom most sheet. A gate structure is formed in and over the dummy gate trench wherein the at least one bottommost sheet forms a device channel for the EG device.

In another method, a stack of alternating layers is formed on a substrate over single gate (SG) regions and extra gate (EG) regions. A hard mask is formed over the stack. The hard mask and the stack are patterned to form nanosheet structures. A dummy gate material is formed over the hard mask and over sides of the nanosheet structures in SG and EG regions. The dummy gate material is planarized and forms dummy gate structures by patterning the dummy gate over the SG and EG nanosheets. A spacer is formed around the dummy gate structure by depositing a conformal dielectric material and using a directional etching process to remove dielectric material from horizontal surfaces and leave dielectric material on vertical surfaces. Source and drain regions for NFETs and PFETs are formed.

In another embodiment, a method for forming semiconductor devices includes forming a stack of alternating layers on a substrate over single gate (SG) regions and extra gate (EG) regions; forming a hard mask over the stack; patterning the hard mask and the stack to form nanosheet structures; forming a dielectric material over the hard mask and over sides of the nanosheet structures in EG regions; recessing the dielectric material below a topmost semiconductor layer of the nanosheet structures in EG regions; forming a spacer layer over side portions of the topmost semiconductor layer to protect the topmost semiconductor layer in EG regions; removing the dielectric material; etching away semiconductor layers of the nanosheet structures for EG devices; etching away layers of the nanosheet structures for the EG devices; and forming a gate structure in and over a dummy gate trench wherein the topmost sheet forms a device channel for the EG device.

A dielectric material (e.g., interlevel dielectric (ILD)) is deposited and planarized to be coplanar with the dummy gate structures. The dummy gate material is removed, and SG device regions are blocked. The nanosheet structures are removed down to a bottom sheet in the EG regions. Blocking material is removed from the SG regions, and the sacrificial layers are removed. N-type materials from the bottom portions of the EG regions and the sacrificial materials in the SG regions are removed. A thick dielectric is formed on channels of the nanosheets for the SG and EG regions and then the EG regions are blocked. The thick dielectric in the SG regions is removed and a thin dielectric is formed in the SG regions. The blocking materials are removed from the EG regions. A high k gate dielectric is deposited over the SG and EG regions and forms the remaining portions of the gate stack electrodes in the SG and EG regions.

A semiconductor device includes a substrate and nanosheet structures. The nanosheet structures each includes a stack of alternating layers on the substrate over single gate (SG) regions and extra gate (EG) regions. The nanosheet structures each includes a central gate structure region and source and drain regions on end portions of the nanosheet structures. The central gate structure region includes a single semiconductor layer of the stack extending between the source and drain regions for EG devices to enable a thicker gate dielectric for the EG devices.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 12 is a cross-sectional view of the substrate of FIG. 11 having spacers formed to protect the topmost sheet in accordance with the present principles;

FIG. 13 is a cross-sectional view of the substrate of FIG. 12 having the porous material removed in accordance with the present principles;

FIG. 14 is a cross-sectional view of the substrate of FIG. 13 having dielectric (oxide) layers removed from the nanosheet structure for EG devices in accordance with the present principles;

FIG. 15 is a cross-sectional view of the substrate of FIG. 14 having semiconductor layers other than the topmost layer removed from the nanosheet structure for EG devices in accordance with the present principles;

DETAILED DESCRIPTION

Figure 1:
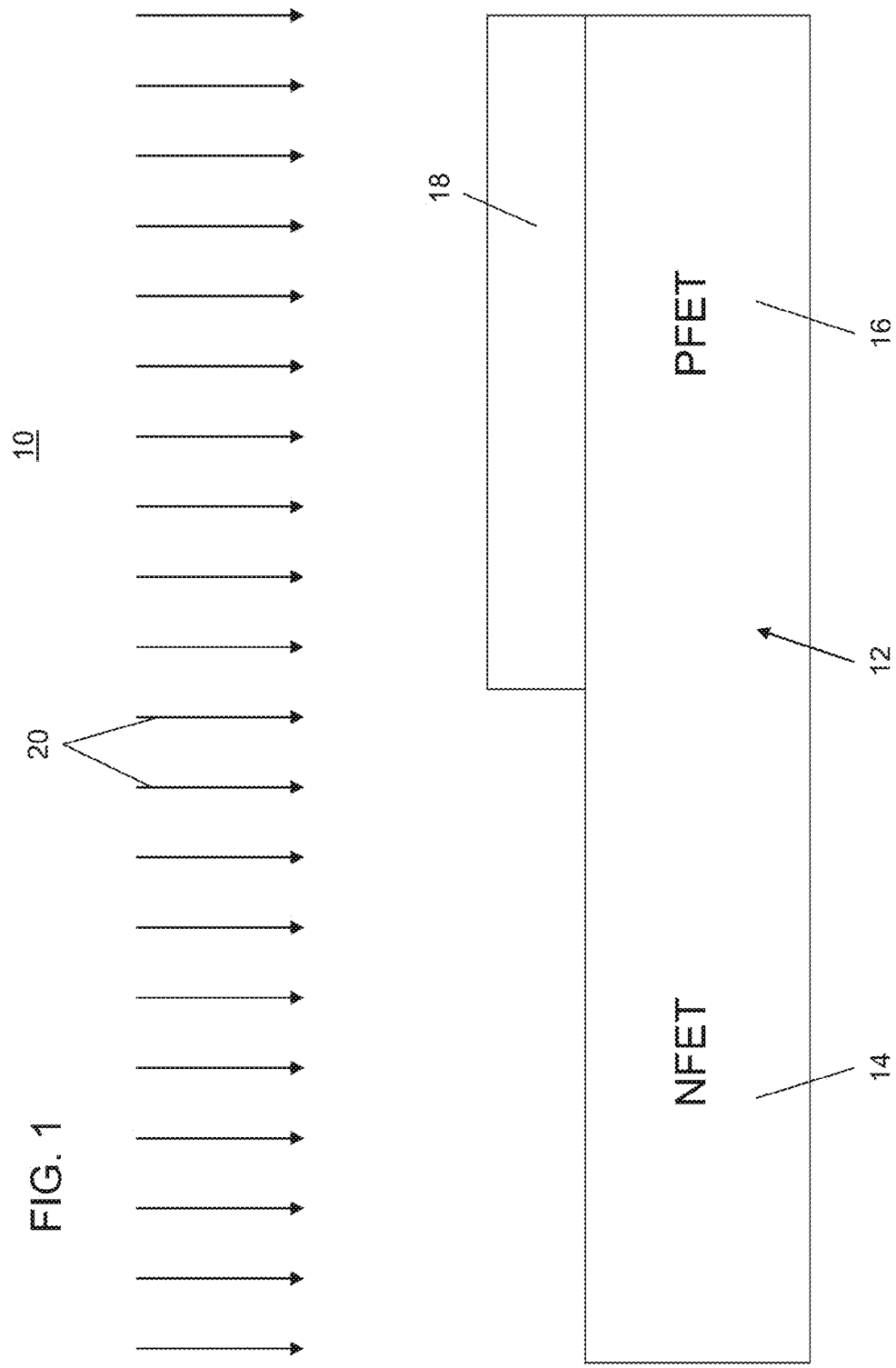
FIG. 1 is a cross-sectional view of a substrate having a P well formed therein in accordance with the present principles.

In accordance with the present principles, extra gate (EG) devices and single gate (SG) devices are integrated together in a complementary metal oxide semiconductor (CMOS) device. EG devices work with higher voltages and therefore include thicker gate dielectric layers on gate structures. When nanosheets are employed, the nanosheets are finely layered for single gate (SG) structures. SG structures refer to devices with thinner gate dielectric. SG devices may be employed, e.g., in logic devices. To mix EG and SG devices is difficult since the EG device need a thicker dielectric than the SG devices. For example, EG devices need a gate dielectric of about 3-5 nm while SG devices need about 1-2 nm. The present principles provide methods and devices that integrate the EG and SG devices on a same chip (e.g. CMOS chip). Spacing between sheets needs to be small enough to realize capacitance benefits (e.g., similar to fin pitch scaling for fin field effect transistors (finFETs). Optimal sheet spacing may be about 8 nm. This space is not enough for appropriate EG dielectric and gate electrode fill EG device structures are provided, which can be co-integrated with a nanosheet. The EG (high voltage) devices can be co-integrated with nanosheet SG (low voltage) devices, where EG devices include a larger space for the EG dielectric film and metal gate formation. Further, the present principles provide block masking to process EG devices and SG devices in a same processing sequence on a same chip to form different gate dielectric layers for each device type.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a partially fabricated device 10 is depicted in accordance with the present principles. The device 10 includes substrate 12. The substrate 12 may include any suitable semiconductor materials, e.g., Si, SiGe, SiC, III-V materials, (e.g., GaAs, InP, etc.) or any other suitable substrate material. In one embodiment, the substrate 12 may be processed for complementary metal oxide semiconductor (CMOS) fabrication, which includes p-type devices and n-type devices. The devices may include field effect transistors (FETs). In one embodiment, the FETs may include FETs formed using nanosheets. Nanosheets include a plurality of thin layers processed together to form fin structures or other structures. In the embodiments described herein, the device 10 will integrate SG and EG devices in a same processing sequence and use the same nanosheet structure for both device types.

Figure 2:
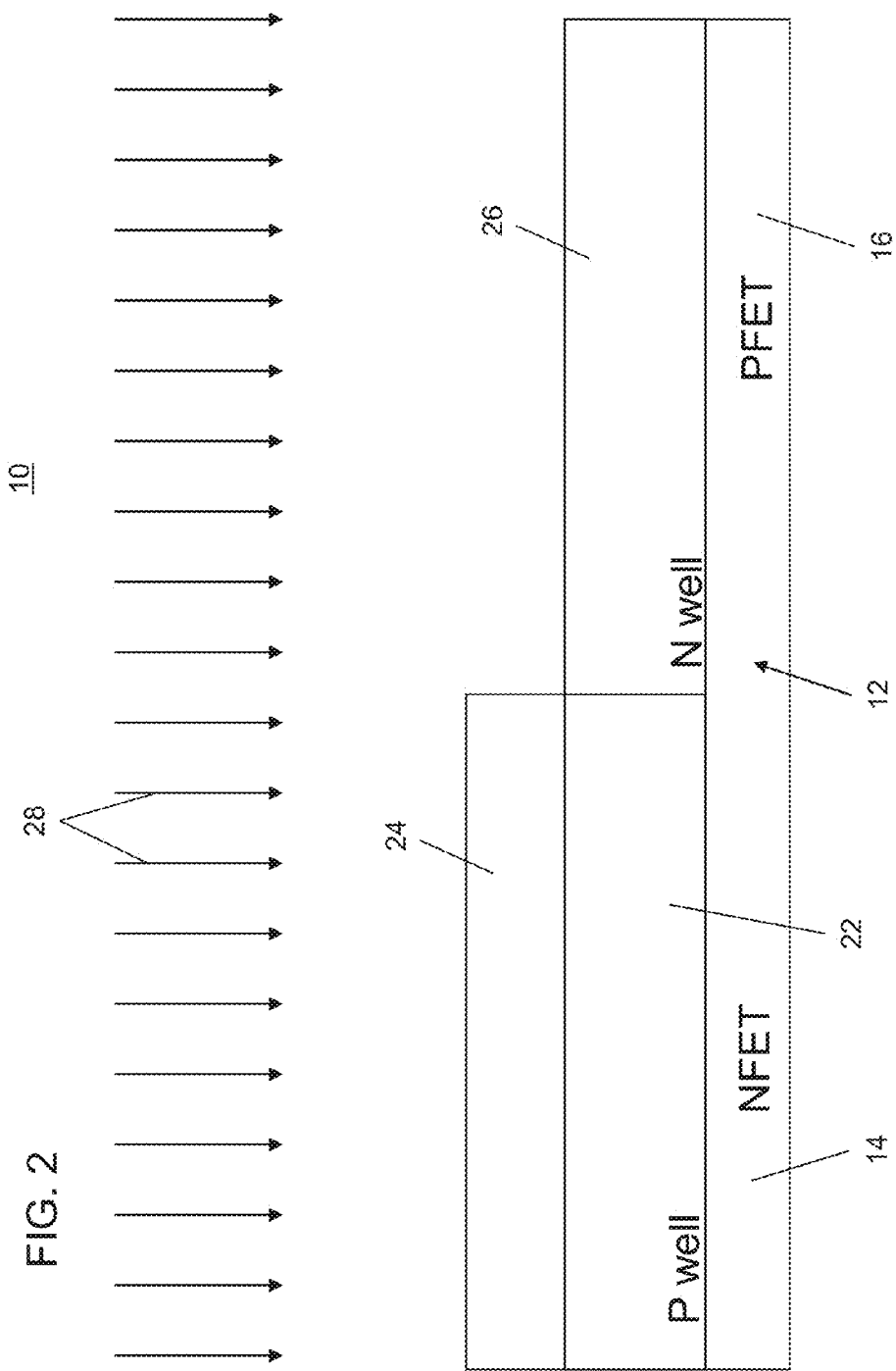
FIG. 2 is a cross-sectional view of the substrate of FIG. 1 having an N well formed therein in accordance with the present principles.

A block level lithography process may include forming a resist or other masking materials 18 on the substrate 12 and patterning the mask 18 to cover a p-type field effect transistor (PFET) region 16 and expose an n-type field effect transistor (NFET) region 14. The NFET region 14 is then implanted with P type dopants to form a PFET well 22 (FIG. 2). It should be understood that the order of well formation may be reversed, e.g., the block mask 18 may be patterned to cover the n-doped region to dope the p-doped wells first and the process steps of FIGS. 1 and 2 can be reversed.

Referring to FIG. 2, a block level lithography process may include forming a resist or other masking materials 24 on the substrate 12 and patterning the mask 24 to cover the P well 22 and expose the PFET region 16. The PFET region 16 is then implanted with N type dopants to form an N well 26.

Figure 3:
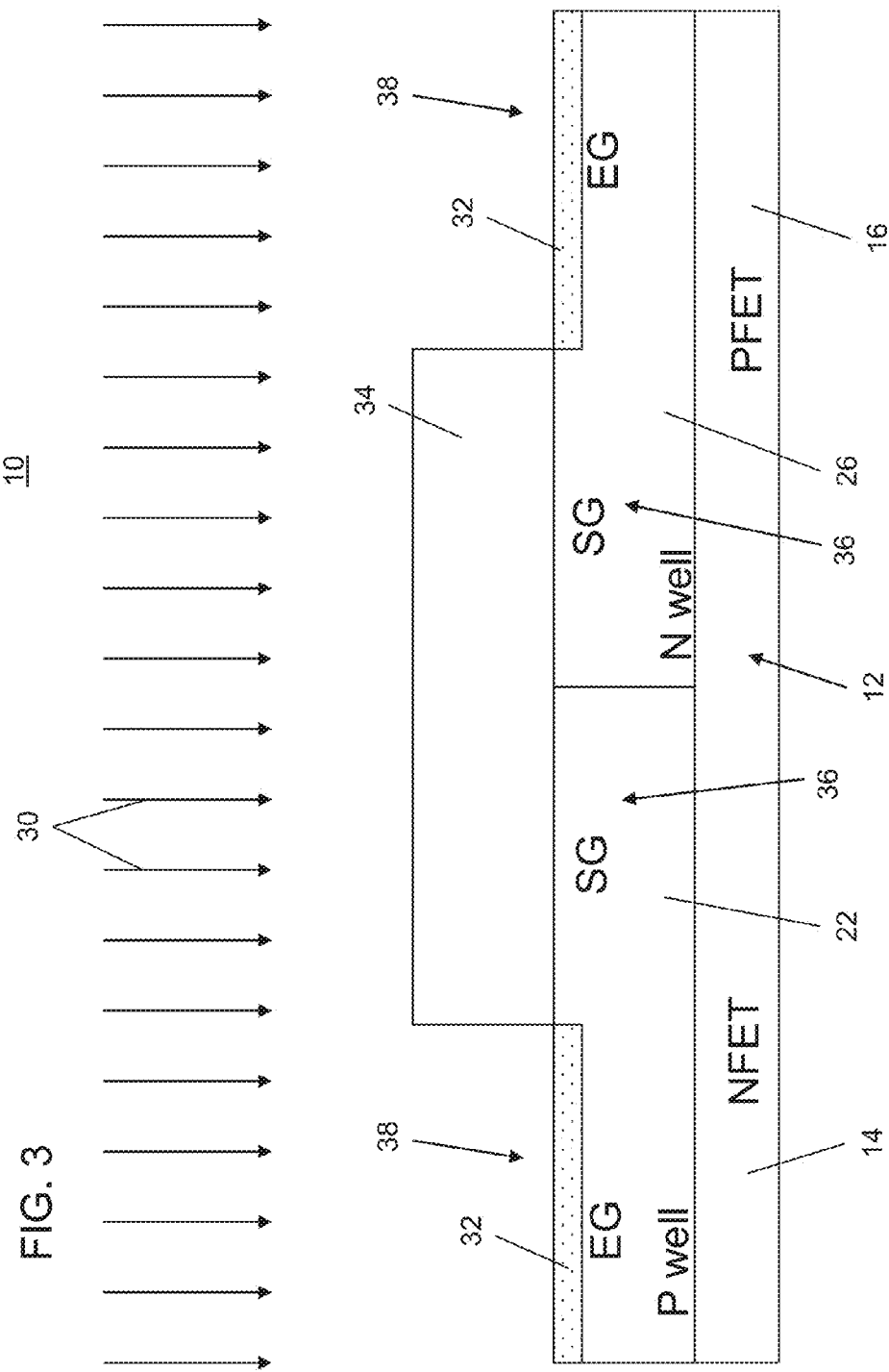
FIG. 3 is a cross-sectional view of the substrate of FIG. 2 having single gate (SG) regions blocked to form highly doped regions in extra gate (EG) regions in accordance with the present principles.

Referring to FIG. 3, the block level lithographic mask 24 is replaced by another lithographic mask 34. The masks 18, 24, 34 may include a resist or a hard mask patterned using resist, e.g., SiN or other hard mask materials. The mask 34 is removed in areas where SG devices (SG areas 36) will be formed and remains in areas 38 where EG devices will be formed. This leaves areas 38 exposed. An ion implantation process is performed to implant n-type dopants into the EG areas 38 to form highly doped n-type regions 32 in the P well 22 and the N well 26.

Figure 4:
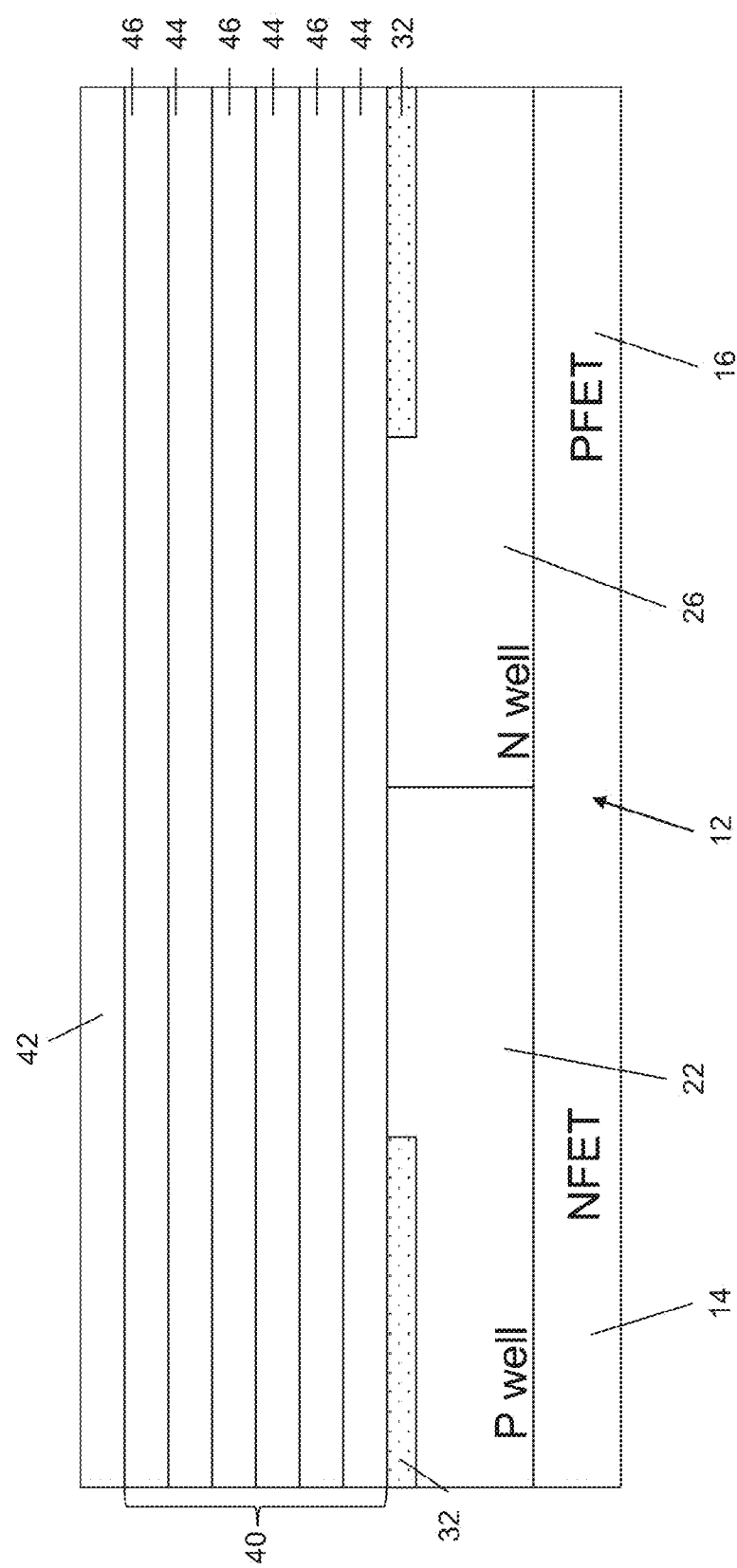
FIG. 4 is a cross-sectional view of the substrate of FIG. 3 having alternating layers of Si and SiGe formed thereon to be removed to at a later point in the process flow to form or release the nanosheet channel regions.

Referring to FIG. 4, a nanosheet stack 40 is grown on the regions 32, P well 22 and N well 26. The stack 40 includes layers 44 and layers 46, which alternate. While other materials may be employed, it is advantageous to grow the layers 44 of SiGe and the layers 46 of Si epitaxially to maintain crystal structure and lattice match the underlying materials, e.g., Si. The SiGe layers 44 will then be removed later in the process flow using, e.g., an HCl process, and the Si layers 46 will remain to be used as the channel of the devices. A hard mask layer 42 is formed over the stack 40. The hard mask 42 may include a silicon nitride or other suitable materials.

Figure 5:
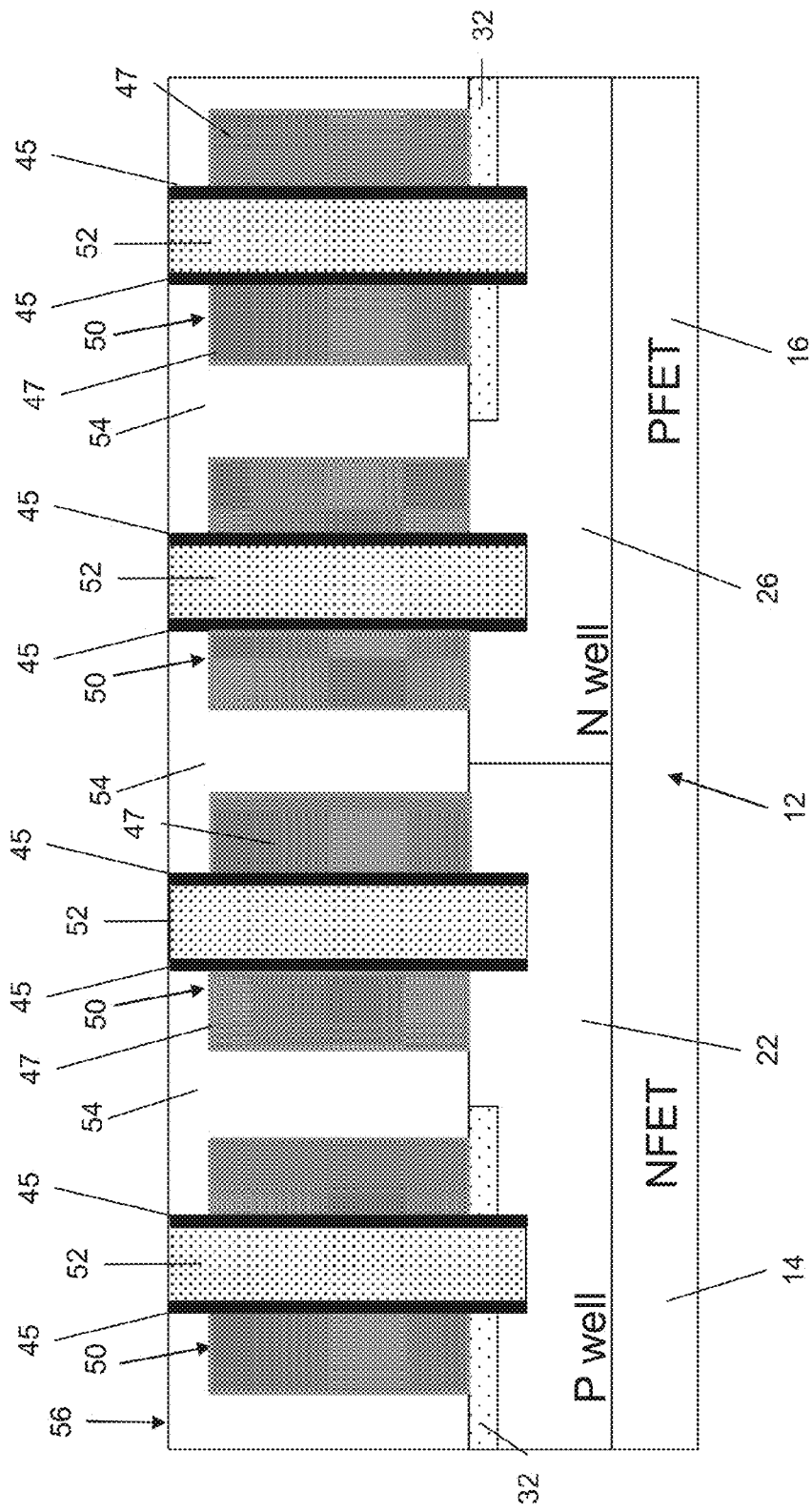
FIG. 5 is a cross-sectional view of the substrate of FIG. 4 having dummy gates, spacers and source and drain regions formed over and in between nanosheet structures in accordance with the present principles.

Referring to FIG. 5, the hard mask 42 is patterned and employed to etch the stack 40 to form nanosheet structures 50. The nanosheet structures 50 are spaced apart from each other by a spacing pitch. A dummy gate material 52 is deposited over the top and in between the structures 50 (going into the page). The dummy gate material 52 may include amorphous or polysilicon, although other materials may be employed. Additionally, there may be a dummy gate dielectric formed underneath the dummy gate material as well as a dielectric hard mask material on top of the dummy gate material (not shown). The dummy gate material 52 is next patterned using lithographic and dry etch processes. Spacers 45 are next formed by depositing a conformal dielectric followed by employing a directional dry etching process. After spacer formation source drain regions 47 are fabricated using CMOS process steps (e.g., epitaxial growth of doped semiconductor materials). An interlevel dielectric layer (ILD) 54 is then deposited over the structures 50 and dummy gate 52. The ILD 54 may include an oxide. A planarization process is employed to planarize the dielectric down to be coplanar with a top 56 of the dummy gates 52. The planarization process may include a chemical mechanical polishing (CMP) process.

Figure 6:
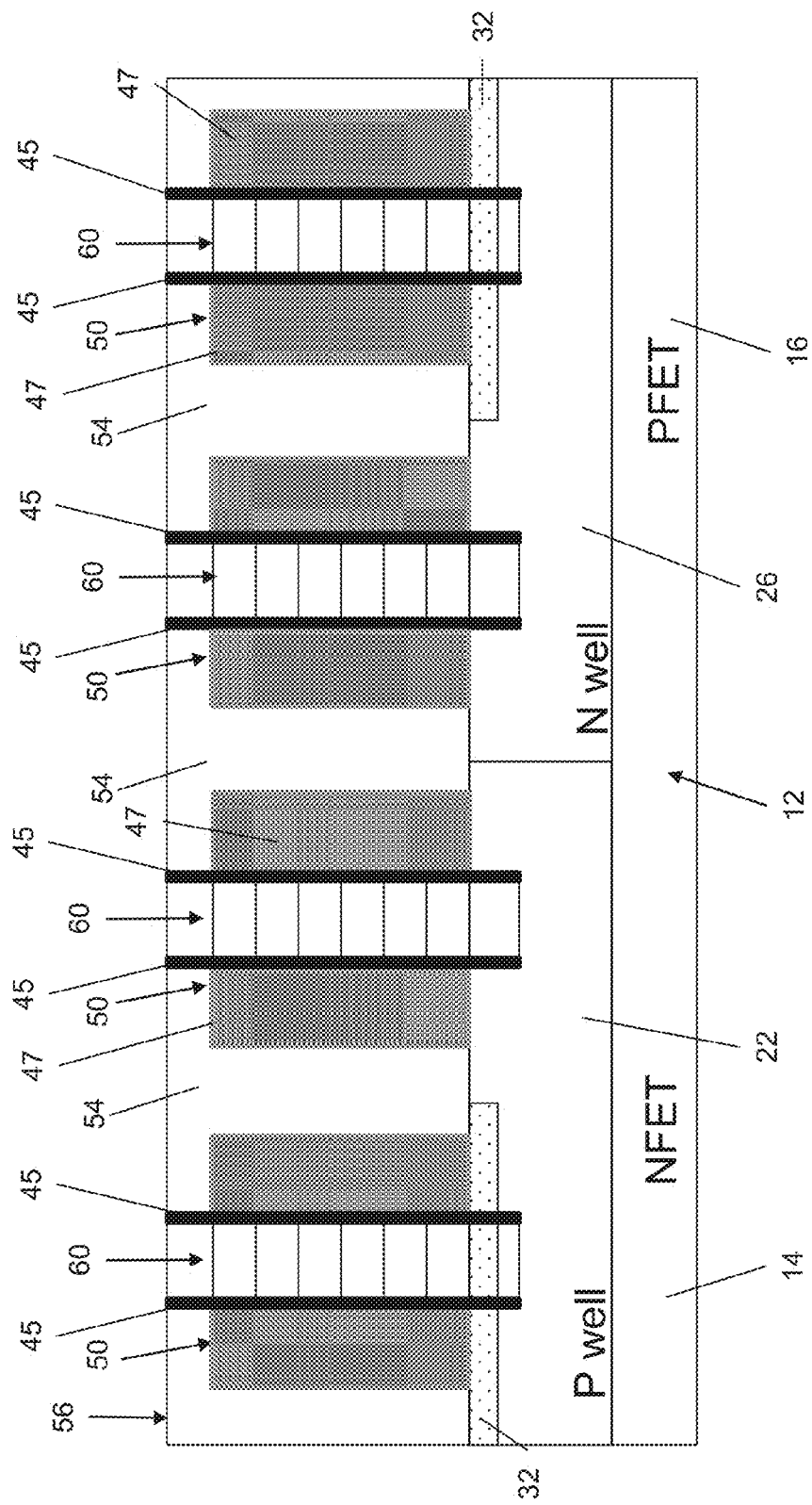
FIG. 6 is a cross-sectional view of the substrate of FIG. 5 having the dummy gates pulled from over and in between nanosheet structures in accordance with the present principles.

Referring to FIG. 6, a process is performed to remove the dummy gate material 52 from over and in between the structures 50 (represented as exposed layers of the nanosheet structures in trenches 60). The dummy gate open process may include a selective etch to remove dummy gate material (e.g., polysilicon) selectively to the materials of the structures 50. The etch process removes a top portion of the ILD 54 and extends into the P well 22 and N well 26 for SG devices and through the doped layer 32 and into the P well 22 and N well 26 for EG devices. With the removal of the dummy gate material 52 to open trenches 60, fronts and backs of the structures 50 are exposed in a dummy trench line within the ILD material 54.

Figure 7:
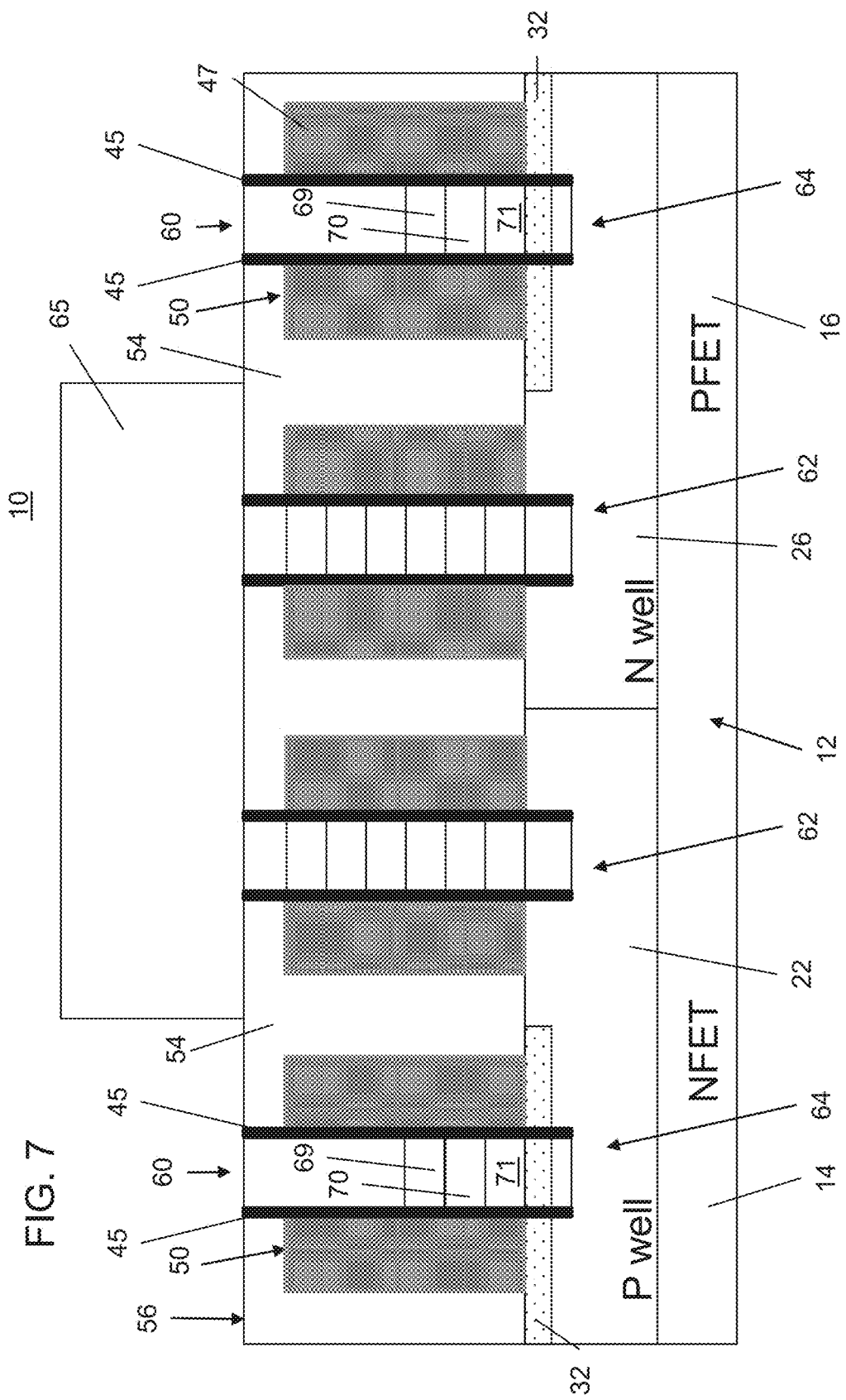
FIG. 7 is a cross-sectional view of the substrate of FIG. 6 having SG regions blocked to remove sheets along a dummy gate trench line for EG devices in accordance with the present principles.

Referring to FIG. 7, SG devices 62 are blocked by a mask 65. The mask 65 is deposited and patterned to block the SG devices 62 and expose the EG devices 64. The block or mask 65 may include a resist, a nitride, and oxide or other suitable material. Then, the ILD 54 protects portions of the EG devices 64 to provide a window over trenches 60. The etch process is directional and removes a sheets from the EG devices 64 in trenches 60 down to a sheet 70. The removal of the sheets lowers a depth for the gate trench 60 and permits the formation of a thicker gate dielectric layer. A remaining sheet 70, which remains in contact with layers 69 and 71 (which may include an oxide or SiGe), will form a channel region between the adjacent portions of the structure 50. Layers 69 and 71 will be removed to release layer 70 in the next step. The mask 65 blocking the SG devices 62 is then removed so that remaining SiGe layers (e.g., not Si layers) for the SG regions 62 and the n-type doped regions 32 are removed using, e.g., a dry HCl process. Etching occurs from exposed end portions of the regions to be removed. Alternating Si layers (75) remain for the SG devices 62 with empty spaces (171) therebetween.

The present principles describe the structure 50 with three semiconductor layers, where a single semiconductor layer is employed for the EG devices 64. However, it should be understood that the number of semiconductor layers may be greater or less than the number shown and that the EG devices 64 may employ more than one sheet for a channel region.

Figure 8:
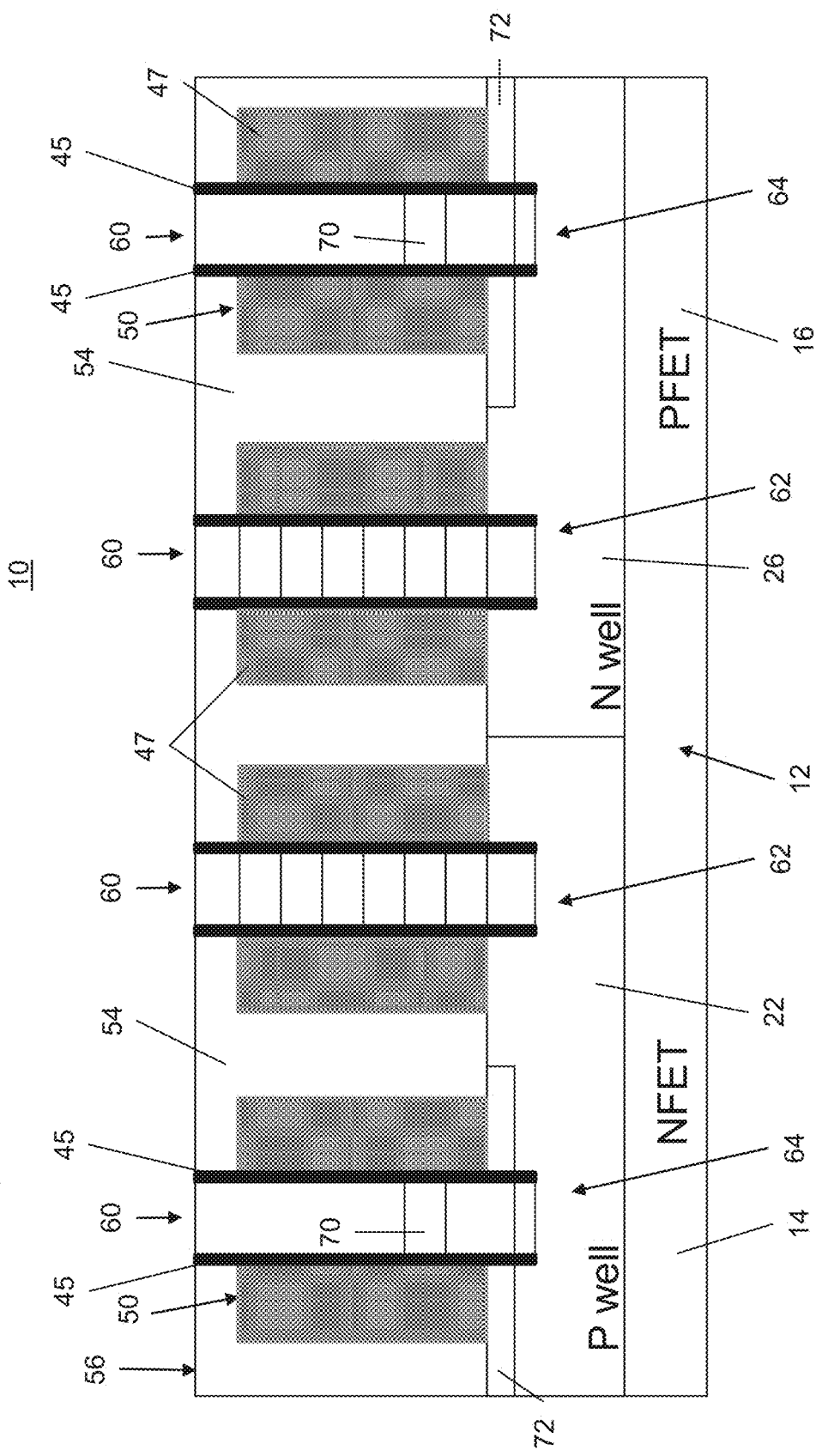
FIG. 8 is a cross-sectional view of the substrate of FIG. 7 having a bottommost sheet released and the highly doped region removed to form a bottom release region for EG devices and sacrificial sheets removed for SG devices in accordance with the present principles.

Referring to FIG. 8, an etch is performed selective to Si layers to remove layer 69 to release layer 70. A bottom release region or area 72 is formed where layer 32 was removed. Additional processing for forming gate dielectric layers for EG and SG devices is described beginning at FIG. 16.

Figure 9:
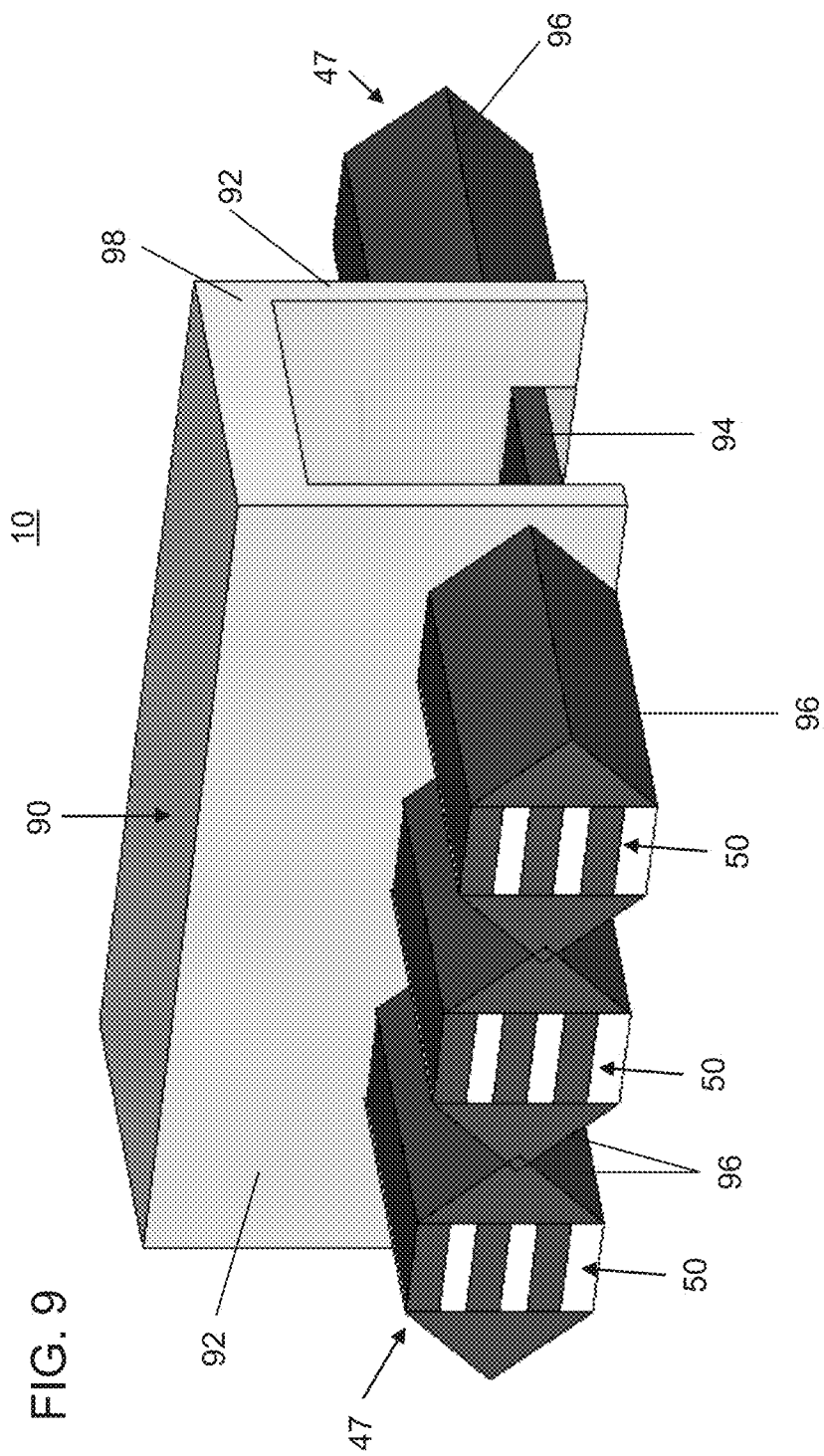
FIG. 9 is a perspective view of the device of FIG. 8 with materials removed to view the bottommost layer, showing a gate structure formed and showing source and drain regions formed in accordance with the present principles.

Referring to FIG. 9, a perspective view of the device 10 is shown with a gate structure 90 formed through structures 50. The gate structure 90 shows spacers 92 and the single semiconductor layer 94 (or 70) released for illustrative purposes. The gate structure 90 will include a gate dielectric layer, a gate conductor, barrier layers, etc. (not shown). The structures 50 include source and drain regions (47) with epitaxially grown portions 96. The gate structure 90 may include a cap 98.

Figure 10:
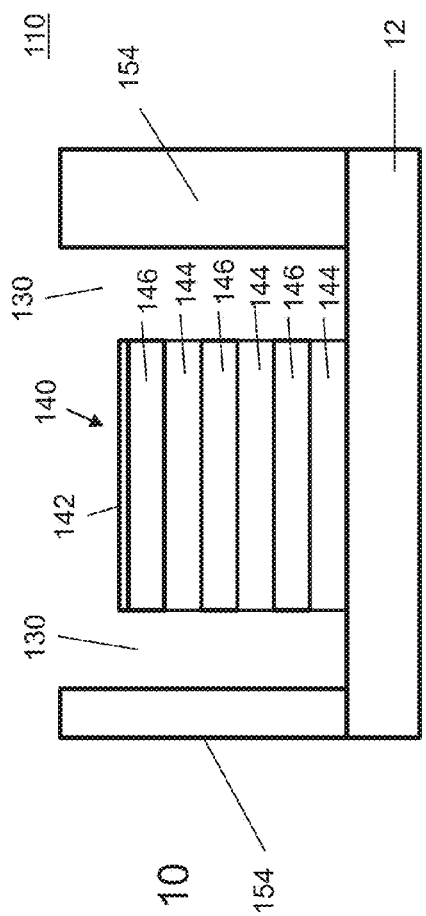
FIG. 10 is a cross-sectional view of a nanosheet structure after a dummy gate pull and having trenches formed on sides of the structure in accordance with another embodiment.

Referring to FIG. 10, an alternate embodiment is shown where a top sheet is retained (instead of a bottom sheet), eliminating the need for the bottom release region as in FIG. 8. The process begins after the dummy gate pull. A nanosheet stack 140 is grown on the substrate 12 with P wells and N wells as described above. The stack 140 includes layers 144 and layers 146, which alternate. While other materials may be employed, it is advantageous to grow the layers 144 of SiGe and the layers 146 of Si epitaxially to maintain crystal structure and lattice match the underlying materials, e.g., Si. The SiGe layers 144 may be converted to silicon oxide or removed selectively with respect to the Si layers 146 using an HCl etch at a later point in the process flow. A hard mask layer 142 is formed over the stack 140. The hard mask 142 may include a silicon nitride or other suitable materials. Trenches 130 are formed between the stack 140 and ILD 154.

Figure 11:
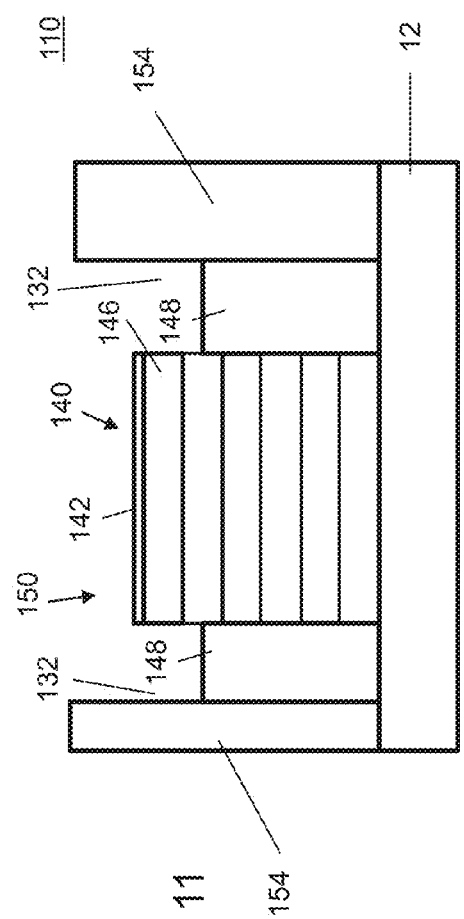
FIG. 11 is a cross-sectional view of the substrate of FIG. 10 having the trenches filled with a dielectric material and recessed below a topmost sheet in accordance with the present principles.

Referring to FIG. 11, the trenches 130 are filled and the hard mask 142 is covered by a dielectric material 148. The material 148 may be porous and include an oxide, an oxide glass, e.g., TEOS, etc. The material 148 is planarized, e.g., using a CMP process. Then an etch process is performed to open an EG device region 150 and form recesses 132.

Referring to FIG. 12, a spacer layer is conformally deposited to cover the hard mask 142, the porous material 148 and exposed sidewalls of the stack 140 and the ILD 154. Sidewall spacers 160 are formed by a directional etch to leave the spacers 160 on sidewalls. The spacer materials may include a higher density oxide or nitride.

Referring to FIG. 13, the porous material 148 is removed from the trenches 130 by an etch process. The topmost layer 146 is protected by the hard mask 142 and sidewall spacers 160. The etch is selective to the materials in the stack 140, the ILD 154 and the substrate 12.

Referring to FIG. 14, the layers 146 that are unprotected by the hard mask 142 and spacers 160 are removed by a selective etch process. The etching process may etch a portion 138 of the substrate 12.

Referring to FIG. 15, the layers 144 are removed followed by the removal of the spacers 160. This leaves the topmost layer 146, which may be employed as a device channel as described above for FIG. 1-9. FIGS. 10-15 illustratively depict a process where the topmost layer 146 is employed toe EG devices. The process steps and sequence follows the methods as described in FIGS. 1-9 even though certain details have been left out for simplicity.

Figure 16:
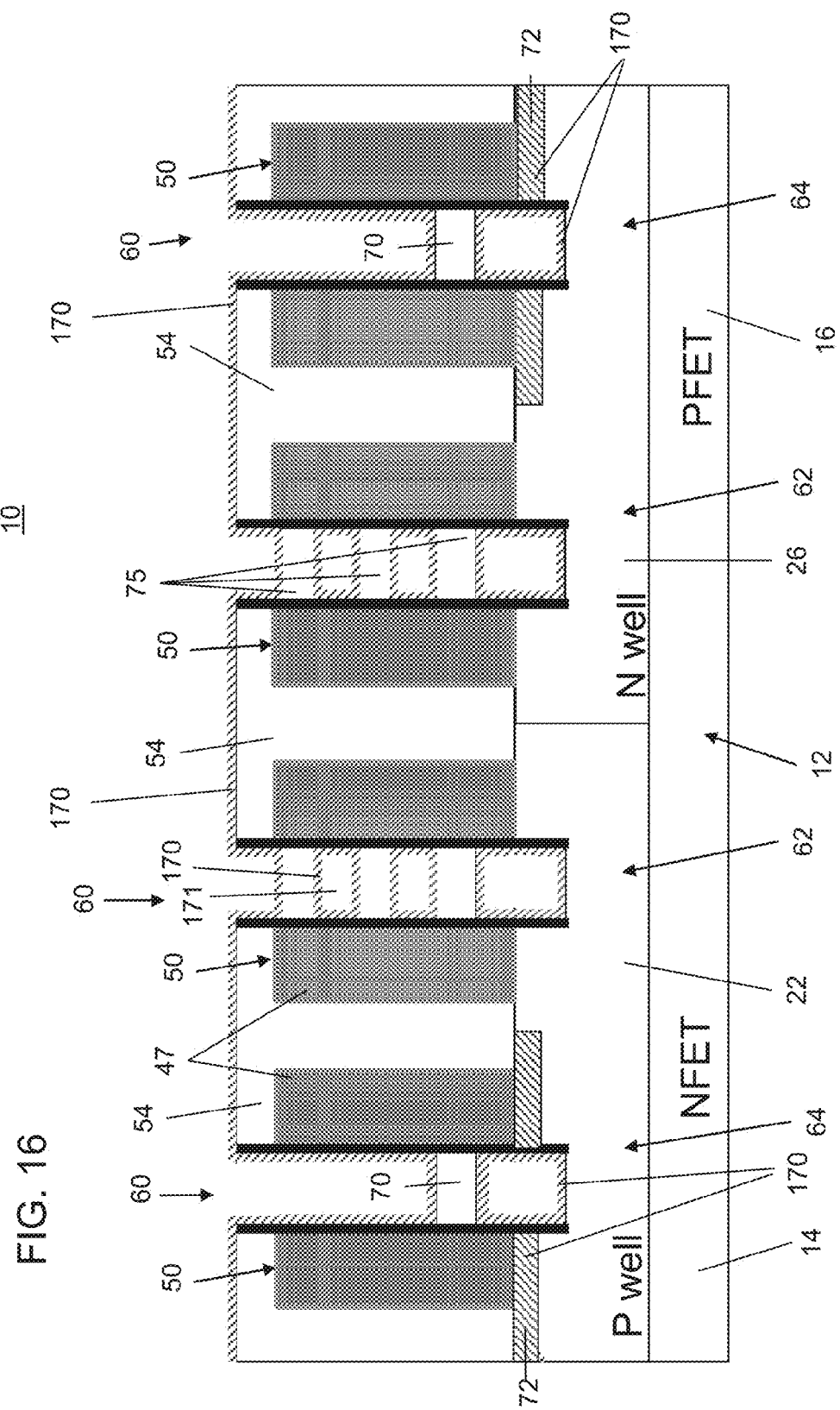
FIG. 16 is a cross-sectional view of the substrate of FIG. 8 having a first dielectric layer formed on EG devices and SG devices in accordance with the present principles.

Referring to FIG. 16, from the structure of FIG. 8, additional processing is performed to form a gate structure 90 (FIG. 9), the block mask 65 is removed. A first dielectric layer 170 is formed over the top of EG and SG devices and on the sidewall spacers 45 in the trenches 60. In one embodiment, the first dielectric layer 170 includes a conformal dielectric layer, e.g., oxide, which is deposited using, e.g., a chemical vapor deposition process (CVD) or an atomic layer deposition (ALD) process. The deposited dielectric layer fills conformally everywhere including under the nanosheet structures 50 in release area 72 and covers semiconductor layers/sheets 75 (e.g., Si) in the SG regions 62 and layer/sheet 70 in the EG regions 64. Empty spaces 171 are disposed between layers/sheets 75 in the SG regions 62. An ALD process, in one example, is capable of depositing material under overhangs wherever there is exposed surface to completely coat or fill the surfaces of the release area 72, semiconductor layers/sheets 75 and layer/sheet 70 with dielectric 170.

Figure 17:
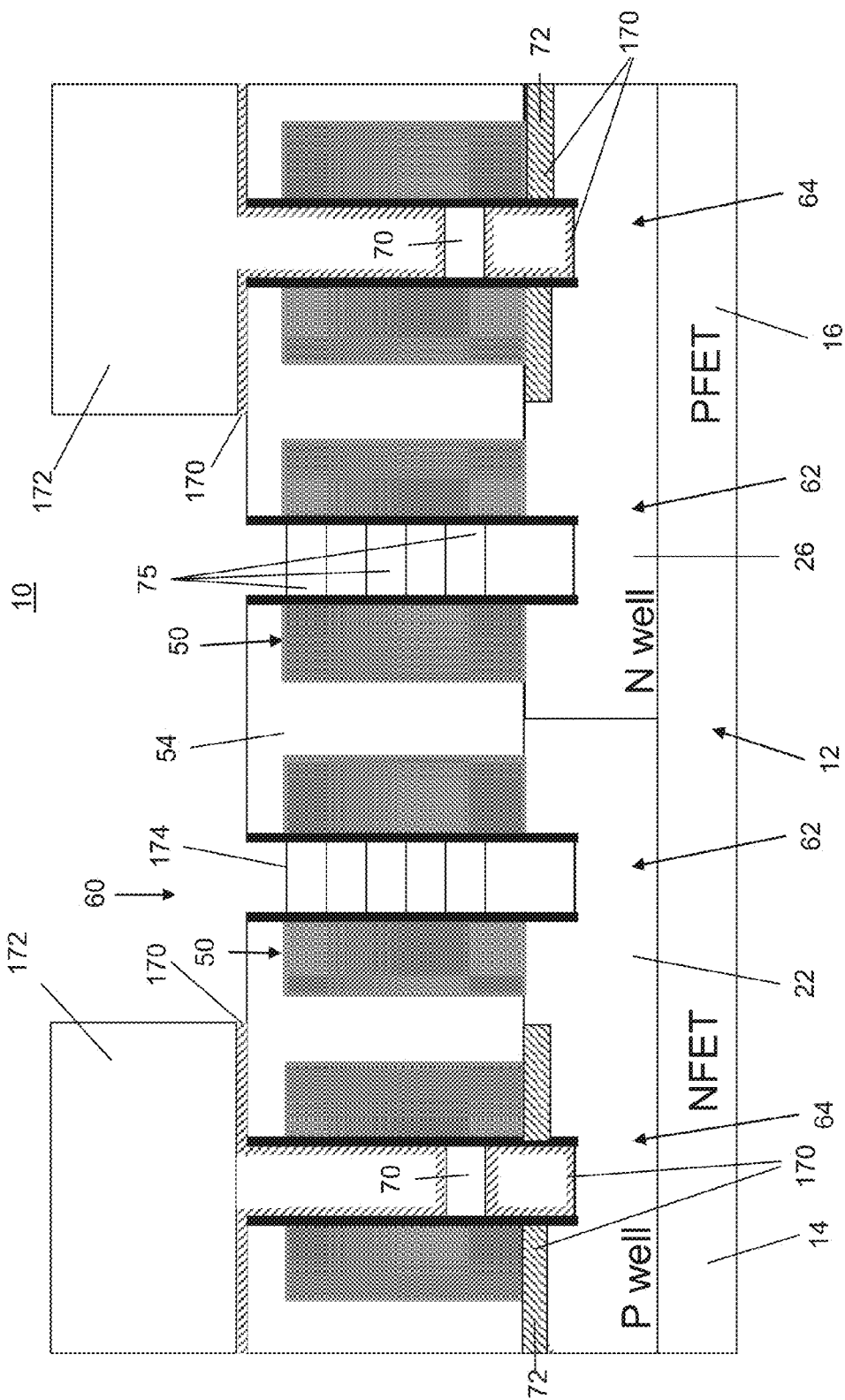
FIG. 17 is a cross-sectional view of the substrate of FIG. 16 having the first dielectric layer removed from the SG devices and an oxide formed on the SG devices by blocking the EG devices in accordance with the present principles.

Referring to FIG. 17, the EG devices 64 are covered with a patterned block mask 172. The first dielectric layer 170 is etched back on the SG devices 62. An interface layer (IL) 174 is formed on the surface of the SG devices 62. The interface layer 174 may be formed using a chemical oxidation process that selectively grows thin $SiO_2$ on the exposed SG silicon regions 62. The block mask 172 can be removed before or after the chemical oxidation process.

Figure 18:
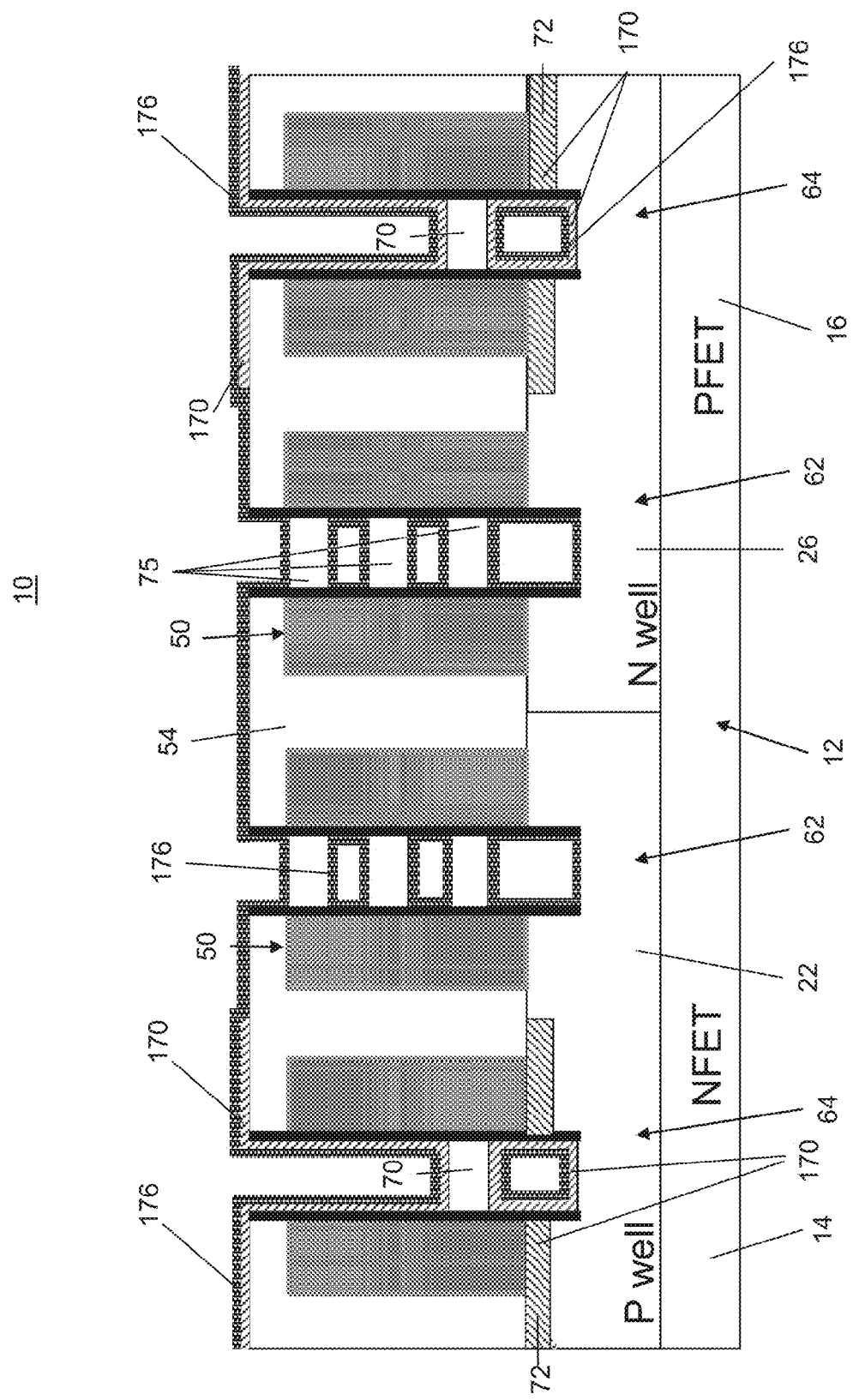
FIG. 18 is a cross-sectional view of the substrate of FIG. 17 having a high-k dielectric layer formed on EG devices and SG devices in accordance with the present principles.
Figure 19:
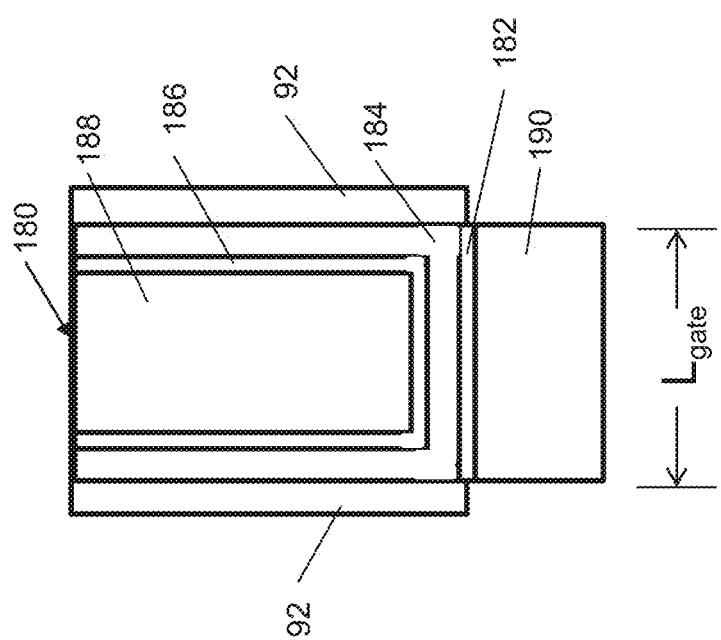
FIG. 19 is a cross-sectional view showing a gate structure in greater detail in accordance with the present principles.

Referring to FIG. 18, a high-k dielectric 176 is formed on both SG devices 62 and EG devices 64. Processing continues with the formation of additional layers for forming a gate structure. Further processing includes deposition of other materials to form the gate structures (FIG. 19). After formation of the gate structure a planarizing step (e.g., CMP) may be performed to remove layers from a top surface of the ILD 54.

Referring to FIG. 19, an example of a gate structure 180 is shown in accordance with one illustrative embodiment. A cross-sectional view of the gate structure 180 is included between spacers 92 (45). The gate structure 180 is formed on nanosheet 190. The nanosheet 190 includes an interface layer (IL) 182, which is grown on or deposited on the nanosheet 190. The IL 182 may include an oxide or an oxynitride. A high-k dielectric material 184 (176) is formed over the IL 182 and over sidewalls spacers 92. The high-k dielectric layer 184 and the IL 182 form the gate dielectric for the gate structure 180. The nanosheet 190 may include the bottommost sheet (e.g., sheet 70, FIG. 8) or the topmost sheet 146 (FIG. 15). For EG devices, the IL 182 may include a deposited oxide, or may include a grown oxide and a deposited oxide.

A diffusion barrier layer 186 may be formed on the high-k dielectric layer 184. The diffusion barrier may include TiN, although other materials may be employed, such as, e.g., TaN, etc. A work function setting material 188 may be formed on the diffusion barrier layer 186. A main conductor (not shown) may be formed on or within the work function setting material 188. The main conductor may include materials, such as W, Al, or other highly conductive materials. The gate length ($L_{gate}$) is enlarged for EG devices by creating more room in the gate trench and by reducing pinch-off within the gate trench, which otherwise limits gate dielectric thickness. The SG devices have a similar structure with a thinner dielectric that may include the high-k dielectric layer 184 and a thinner IL 182, no ILD, a thinned deposited oxide or a grown oxide, etc.

Figure 20:
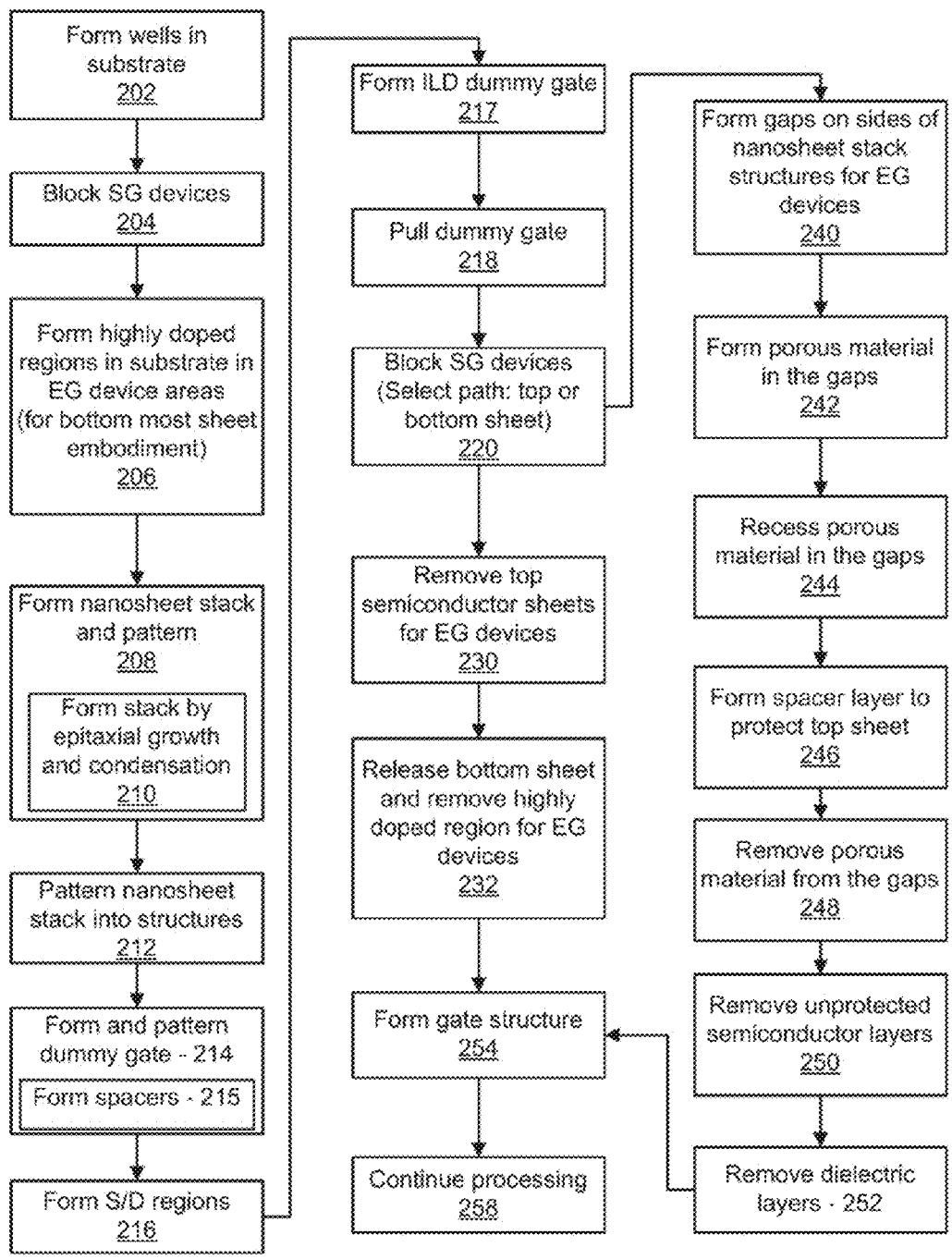
FIG. 20 is a block/flow diagram showing methods form forming semiconductor devices with different gate dielectric sizes in accordance with illustrative embodiments.

Referring to FIG. 20, methods for forming semiconductor devices are provided in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a substrate is doped to form P wells for NFET devices and N wells for PFET devices to form a CMOS device. N wells and P wells form P-type and N-type devices for both SG devices and EG devices.

In block 204, a block or mask is formed on the substrate to cover single gate (SG) regions. In block 206, a surface of the substrate in exposed areas where extra gate (EG) devices are to be formed is doped to form a highly doped region at or near a surface of the substrate. This step and block 204 are skipped if topmost semiconductor sheets are employed (e.g., blocks 240-252). In block 208, a stack (a nanosheet stack) of alternating semiconductor and dielectric layers is formed on the substrate over single gate (SG) regions and the EG regions. The nanosheet structures may include alternating layers of Si and SiGe or SiGe and silicon dioxide (the silicon dioxide layers may be removed). A hard mask may be formed on the stack.

In block 210, the nanosheet structures may be formed by epitaxially growing alternating layers of the Si and SiGe. In one embodiment, Ge may be condensed (e.g., by annealing in the presence of oxygen) from the SiGe to turn the SiGe into oxide and the Si into SiGe. The stack of alternating semiconductors (and/or dielectric layers) may include at least three semiconductor layers. The some layers may be removed and replaced later with semiconductor material for S/D regions.

In block 212, the stack is patterned to form nanosheet structures. The nanosheet structures are longitudinally disposed and may be in the form of fin-like structures with multiple layers. In block 214, a dummy gate structure is formed and patterned transversely over the fin-like nanosheet structures. In block 215, sidewall spacers are formed in a dummy gate trench. In block 216, source and drain (S/D) regions are formed on opposite sides of the dummy gate structure. This may include epitaxially growing S/D regions using the semiconductor layers at end positions of the fin-like nanosheet structures. This process may be performed at other times in the process sequence.

In block 217, an ILD layer is formed over the dummy gate structure. The ILD and dummy gate structure(s) are polished to expose the dummy gate structure for a dummy gate pull. In block 218, the dummy gate structure is removed or pulled to form a trench in a dummy gate line over and between the nanosheet structures. In block 220, the SG regions are blocked to process the EG devices.

The method sequence splits depending on which of the semiconductor nanosheets are to be employed to fabricate the EG device. One path employs the bottommost sheet or sheets while the other path employs the topmost sheet or sheets.

In block 230, top sheets (semiconductor and dielectric layers) are removed from the nanosheet structures along the dummy gate line. In block 232, at least one bottommost sheet is released to form a channel for a field effect transistor device by etching away the highly doped region under the nanosheet structure and layers in contact with the at least one bottommost sheet.

In an alternate path, in block 240, the hard mask is employed to pattern the stack to form nanosheet structures with gaps or trenches between the ILD and the nanosheet structures. In block 242, a porous material (e.g., a glass oxide or TEOS) is formed over the hard mask and over sides of the nanosheet structures. In block 244, the porous material is recessed in the trenches to a point below a topmost semiconductor layer of the nanosheet structures. In block 246, a spacer layer is formed over side portions of the topmost semiconductor layer to protect the topmost semiconductor layer. In block 248, the porous material is removed. In block 250, semiconductor layers of the nanosheet structures, which are unprotected by the spacer layer, are etched away for EG devices. In block 252, dielectric layers of the nanosheet structures for the EG devices are etched away.

In block 254, a gate structure is formed in and over the dummy gate trench wherein the remaining sheet or sheets of the semiconductor layer form a device channel for the EG device. By removing layers of the nanosheet stack more room is available for forming a gate dielectric for EG devices. The SG devices include thinner (e.g., 1-2 nm) gate dielectric than EG devices (e.g., 3-5 nm). The gate structure may include forming an oxide on the remaining semiconductor sheet and depositing a gate dielectric layer on the oxide. The processing may alternate between EG devices and SG devices for forming the gate dielectrics. For example, EG devices and SG devices may be processed using block masks to form gate dielectric layers, etching gate dielectric layers, etc. including different layers, different materials, different thicknesses, etc.

For example, in one embodiment, a first dielectric layer is deposited over the channel materials and one of the SG regions and the EG regions is blocked by a block mask. A thickness of the first dielectric layer is then adjusted by etching of adding additional material to the unblocked the SG regions or the EG regions. The block mask is removed and the SG regions or the EG regions can then be processed together (e.g., a high-k dielectric or other layer may be deposited over both the SG regions and the EG regions.

Then, a gate conductor is formed in the gate structure. Multiple layers may be employed for the gate structure, e.g., oxide, high-k dielectric layer, work function metal, main conductor, diffusion barriers, etc.

In block 258, processing continues to complete the EG and SG devices on the CMOS device.

Having described preferred embodiments from an extra gate device for nanosheets (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming semiconductor devices, comprising:
    doping a surface of a substrate in exposed areas where extra gate (EG) devices are to be formed to form a highly doped region;
    forming a stack of alternating layers on the substrate over single gate (SG) regions and the EG regions;
    patterning the stack to form nanosheet structures;
    forming a dummy gate structure over and between the nanosheet structures;
    forming an interlevel dielectric layer over the dummy gate structure and the nanosheet structures;
    removing dummy gate structures to form a dummy gate trench;
    blocking the SG regions;
    removing top sheets from the nanosheet structures along the dummy gate trench;
    releasing at least one bottommost sheet including a semiconductor layer to form a channel for a field effect transistor device by etching away the highly doped region under the nanosheet structure and layers in contact with the at least one bottom most sheet; and
    forming a gate structure in and over the dummy gate trench wherein the at least one bottommost sheet forms a device channel for the EG device.

2. The method as recited in claim 1, wherein forming the gate structure includes:
    depositing a first dielectric layer;
    blocking one of the SG regions and the EG regions; and
    adjusting a thickness of the first dielectric layer of the other of the SG regions and the EG regions that is unblocked.

3. The method as recited in claim 1, wherein the nanosheet structures are formed over N wells and P wells to form P-type and N-type devices for SG devices and EG devices.

4. The method as recited in claim 1, wherein the nano sheet structures are formed by epitaxially growing alternating layers of the Si and SiGe.

5. The method as recited in claim 1, wherein the SG devices include thinner gate dielectric than EG devices.

6. The method as recited in claim 1, wherein forming the gate structure includes forming an oxide on the at least one bottommost sheet and depositing a gate dielectric layer on the oxide.

7. The method as recited in claim 6, further comprising forming a gate conductor in the gate structure.

8. The method as recited in claim 1, wherein the stack of alternating layers includes at least three semiconductor layers and the at least one bottommost layer includes a third semiconductor layer.

* * * * *